United States Patent [19]
Nakadaira et al.

[11] Patent Number: 5,763,946
[45] Date of Patent: Jun. 9, 1998

[54] SEMICONDUCTOR DEVICE WITH BENT ELECTRODE TERMINAL

[75] Inventors: Yoshikuni Nakadaira, Yokohama; Norio Kawakami; Takahiro Ito, both of Hyogo-ken, all of Japan

[73] Assignee: Kabushiki Kaisha Toshiba, Kawasaki, Japan

[21] Appl. No.: 687,033

[22] Filed: Jul. 25, 1996

[30] Foreign Application Priority Data

Jul. 26, 1995 [JP] Japan ................... 7-190458

[51] Int. Cl.$^6$ ................................................ H01L 23/48
[52] U.S. Cl. ................ 257/693; 257/696; 257/704; 257/730
[58] Field of Search ..................... 257/693, 696, 257/704, 730; 361/730

[56] References Cited

U.S. PATENT DOCUMENTS 4,796,076  1/1989  Ando et al. ................... 257/693
5,646,445  7/1997  Masumoto et al. ............. 257/730

FOREIGN PATENT DOCUMENTS 4-14249  1/1992  Japan.

OTHER PUBLICATIONS

Masujiro Hayama, "Theory of Plasticity and Plasticity Processing", pp. 206–209 (1982).

Primary Examiner—Jerome Jackson
Assistant Examiner—Nathan K. Kelley
Attorney, Agent, or Firm—Finnegan, Henderson, Farabow, Garrett & Dunner, L.L.P.

[57] ABSTRACT

A container has an upper opening, a plurality of semiconductor elements and electrode terminals connected to the semiconductor elements. A cover member closing the opening has insertion holes formed therethrough from its lower surface to its upper surface. The cover member is coupled with the container by inserting the electrode terminals through the insertion holes to make them vertically project from the upper surface, and bending the projecting electrode terminals. The cover member has projections provided adjacent to the insertion holes. Each of the vertically projecting electrode terminals is bent through more than 90° over a corresponding one of the projections, with its bent corner portion supported on the edge of the projection, and arranged parallel to the upper surface of the cover member as a result of a spring back effect.

20 Claims, 7 Drawing Sheets

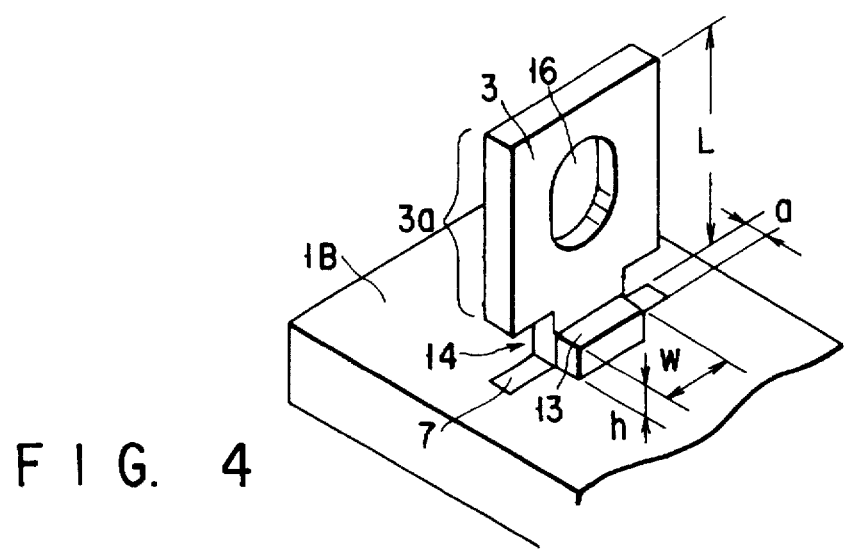
F I G. 4
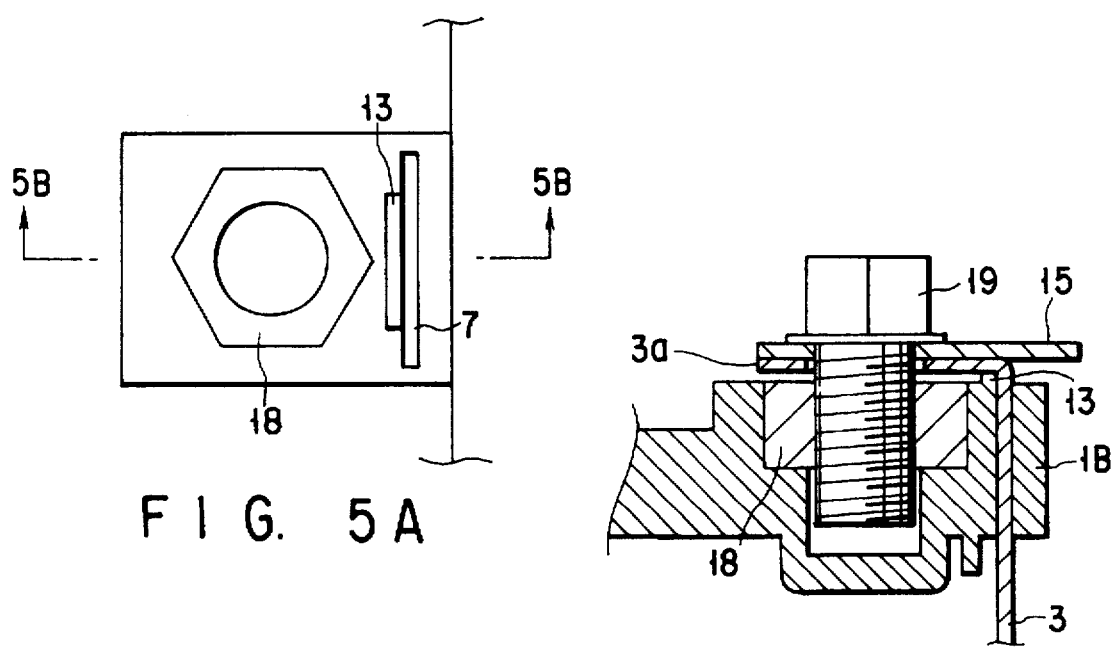
F I G. 5A
F I G. 5C
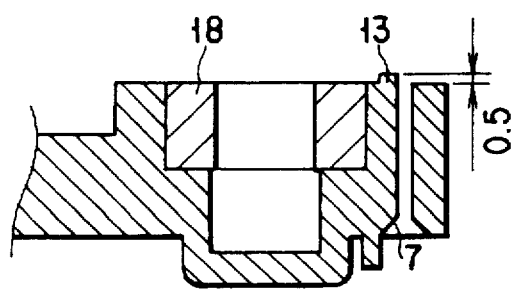
F I G. 5B

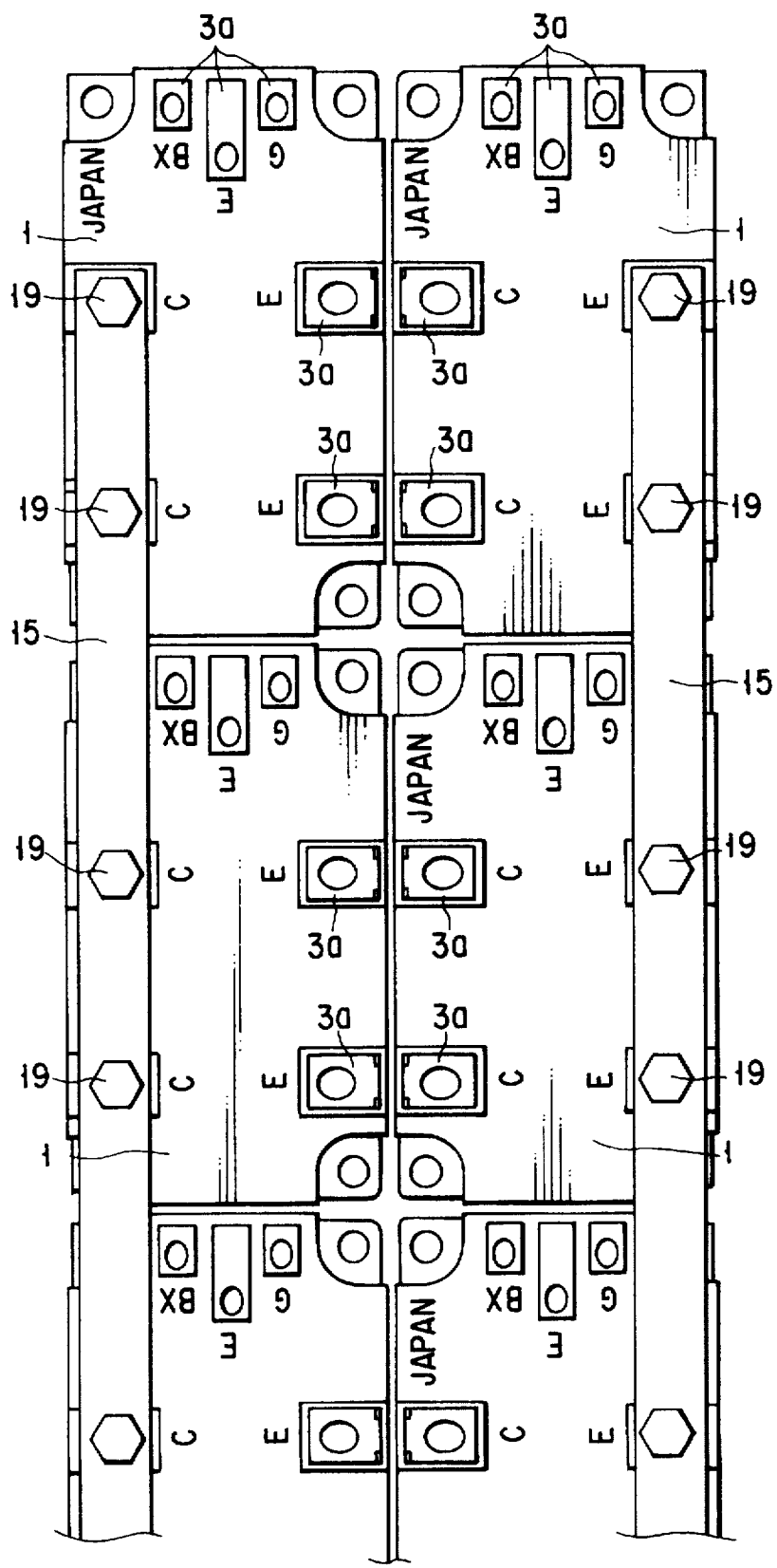
F I G. 6

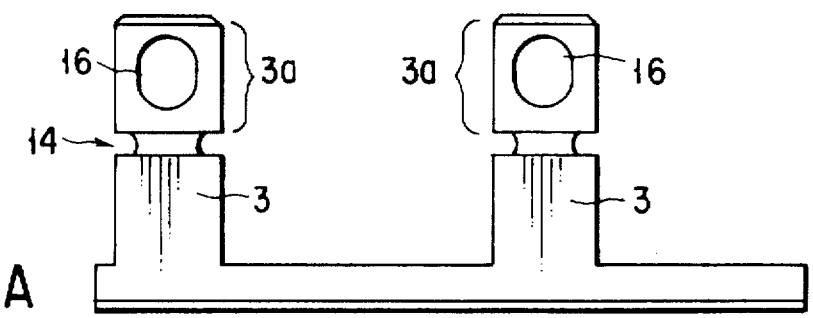
FIG. 8A
   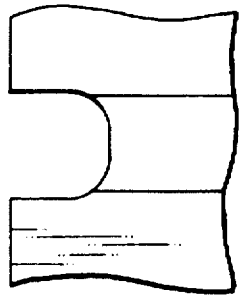   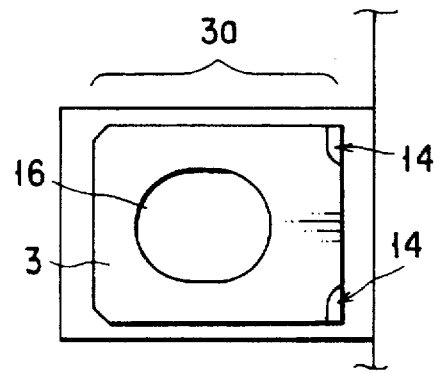
FIG. 8B   FIG. 8C   FIG. 9A
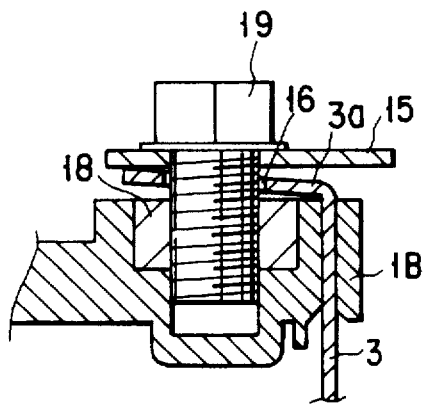   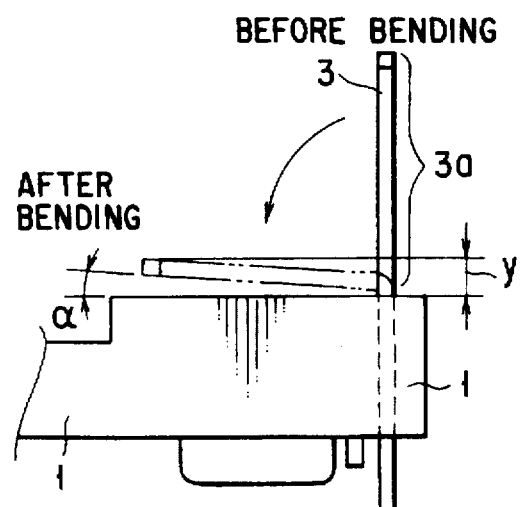
FIG. 10   FIG. 9B

SEMICONDUCTOR DEVICE WITH BENT ELECTRODE TERMINAL

BACKGROUND OF THE INVENTION

1. Field of the Invention

This invention relates to a power module semiconductor device such as an inverter, an AC/DC converting transistor module, a thyristor module, etc., and more particularly to electrode terminals mounted on the package of the semiconductor device.

2. Description of the Related Art

In general, in the field of power electronics for converting a power or performing control, etc., high-power high-speed semiconductor devices used to control a motor, etc. are modularized. FIG. 7 shows an example of a high-power high-speed semiconductor device of this type. This device uses a package called an insert case and formed of a main body 1A and a cover member 1B (in FIG. 7, the main body 1A and the cover member 1B are separated from each other). The main body 1A has a heat sink 6, an insertion case 5, semiconductor elements such as a diode 9, a transistor 10, etc., and a plurality of electrode terminals 3 connected to the semiconductor elements. The insertion case 5 is made of a synthetic resin, and the electrode terminals 3 are formed integral with the insertion case 5 as one body. The insertion case 5 is fixed to the heat sink 6 by means of a joint member (not shown), thereby constituting a container for containing the semiconductor elements 9 and 10. PBT resin or PPS resin is molded into the cover member 1B. The member 1B has insertion holes 7 formed therethrough for inserting the electrode terminals 3.

To mount the cover member 1B on the main body 1A, the electrode terminals 3 are inserted through the insertion holes 7 from below so that they project from the upper surface of the cover member 1B. Those portions of the electrode terminals 3, which project from the upper surface of the cover member 1B and are hereinafter referred to as "external joint portions 3a", are bent inward through 90° by the hand or using a tool, thereby fixing the cover member 1B to the main body 1A.

Further, a plurality of high-power semiconductor devices constructed as above are arranged parallel to each other, and have their electrode terminals electrically connected to each other by means of bus bars. Specifically, the semiconductor elements are arranged in two rows, and bus bars 15 (see FIG. 10) are placed on the external joint portions 3a bent and extending on the cover member 1B. Then, bolts 19 (FIG. 10) are screwed into nuts 18 provided in the cover member 1B, to thereby couple the bus bars 15 with the external joint portions 3a. To this end, each external joint portion 3a has a through hole 16 for receiving the bolt 19, and the cover member 1B has holes 2 wherein the nuts 18 are fitted, as is shown in FIG. 7. Further, the electrode terminals 3 have respective coining portions 14 for facilitating to bend the electrode terminals 3 such that the external joint portions 3a extend parallel to the upper surface of the cover member 1B and the through holes 16 are aligned with the holes 2, and also for facilitating to determine the bending portions of the external joint portions 3a.

FIG. 8A is a front view of the coining portions 14, and FIGS. 8B and 8C are enlarged side and front views of the coining portions 14, respectively. As is evident from these figures, the electrode terminal 3 has its width narrowed and its thickness thinned at the coining portion 14, which enables the terminal 3 to be bent easily. Further, the terminal 3 is bent at the coining portion 14 as shown in FIG. 9A, which means that the bending portion of the terminal 3 can easily be determined.

Actually, however, the electrode terminals 3 have elasticity. Therefore, if the force exerted upon the external joint portion 3a to bend the same is removed, the external joint portion 3a slightly rebounds because of a spring back effect. As is shown in FIG. 9B, the external joint portion 3a does not become completely parallel to the surface of the cover member 1B. In addition, that displacement of the external joint portion 3a from the surface of the cover member 1B varies among products, which is defined by an angle α therebetween and a height "y" from the cover member surface to the tip of the joint portion 3a in FIG. 9B.

Furthermore, as is shown in FIG. 8B, the coining portion 14 is located above the surface of the cover member 1B, and the depression of the coining portion 14 is located inside when the electrode terminal 3 is bent. Thus, the coining portion 14 does not contact the insertion hole 7 of the cover member 1B. Moreover, since the coining portion 14 has a certain width, the bending line cannot accurately be determined. In particular, when workers manually bend the electrode terminals, they bend them at different bending rates, while holding different portions thereof. Accordingly, the electrode terminals inevitably have different bent shapes and bending lines.

Since as described above, the bent external joint portion 3a are not arranged parallel to the surface of the cover member 1B, and do not have the same shape and the same bending line, it is difficult to reliably fasten the electrode terminal 3 to the bus bar 15 by the bolt 19. If the height "y" is higher than a predetermined value, the nut will escape from the hole 18 while the bolt 19 is being screwed, and hence the electrode terminal 3 cannot be fastened to the bus bar 15 by the bolt 19. As a result, the overall surface of the external joint portion 3a will not contact the bus bar 15. In other words, the joint portion 3a only partially contacts the bus bar 15, which will increase the contact resistance therebetween and may well cause an erroneous operation of the semiconductor device.

If the electrode terminals 3 do not have the same bent shape and bending line, it is highly possible that the center of the through hole 16 of the external joint portion 3a of the terminal 3 is not aligned with the center of the nut 18. This makes it difficult to insert the bolt 19 through the hole 16 and screw the same into the nut 18.

SUMMARY OF THE INVENTION

It is the object of the invention to provide a semiconductor device in which the external joint portion of each electrode terminal extends parallel to the surface of a cover member, and is situated in an accurate position.

To attain the object, there is provided a semiconductor device comprising:

a container with an upper opening containing a semiconductor element, and having an electrode terminal connected to the semiconductor element;

a cover member for closing the container, the cover member having an insertion hole formed through the cover member from the lower surface to the upper surface, the container being coupled with the cover member by inserting the electrode terminal through the insertion hole to make the same projecting from the upper surface of the cover member, and bending the projecting electrode terminal; and a projection provided on the upper surface of the cover member in the vicinity of the insertion hole, to support a bent corner portion of the electrode terminal when the electrode terminal is bent, the electrode terminal being arranged parallel to the upper surface of the cover member when it is bent over the projection.

As described above, the semiconductor device of the invention has the projection adjacent to the insertion hole on the surface of the cover member. Since the electrode terminal inserted through the insertion hole can be bent over the projection, with its bent corner portion supported on the edger of the projection, the bending line of the electrode terminal can accurately be determined. As a result, the electrode terminal can have a constant bent shape.

Moreover, the height of the projection is set such that the electrode terminal becomes parallel to the surface of the cover member because of a spring back effect, after it is bent through more than 90° over the projection by an external force exerted thereon and then the force is removed therefrom. Thus, the bent electrode terminal is made parallel to the surface of the cover member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 4 is an enlarged perspective view, showing an insertion portion of an electrode terminal employed in the semiconductor devices of the invention;

FIG. 5A is an enlarged plan view, showing an insertion portion through which the electrode terminal of FIG. 4 is inserted;

FIG. 5B is a sectional view, taken along lines B—B of FIG. 5A;

FIG. 5C is a sectional view, showing a state in which the electrode terminal is coupled with a bus bar;

FIG. 6 is a plan view, showing a plurality of semiconductor devices coupled with each other by the bus bars;

FIG. 8A is a front view, showing an electrode terminal employed in the conventional semiconductor device;

FIG. 8B is an enlarged side view, showing an essential part of FIG. 8A;

FIG. 8C is an enlarged front view, showing an essential part of FIG. 8A;

FIG. 9A is a plan view, showing a bent electrode terminal employed in the conventional semiconductor device;

FIG. 9B is a side view of FIG. 9A; and

FIG. 10 is a sectional view, showing a state of the conventional semiconductor device, in which a bus bar and the electrode terminal are coupled with each other by means of a bolt.

DETAILED DESCRIPTION OF THE PREFERRED EMBODIMENT

The embodiment of the invention will be described in detail with reference to the accompanying drawings.

Figure 1:
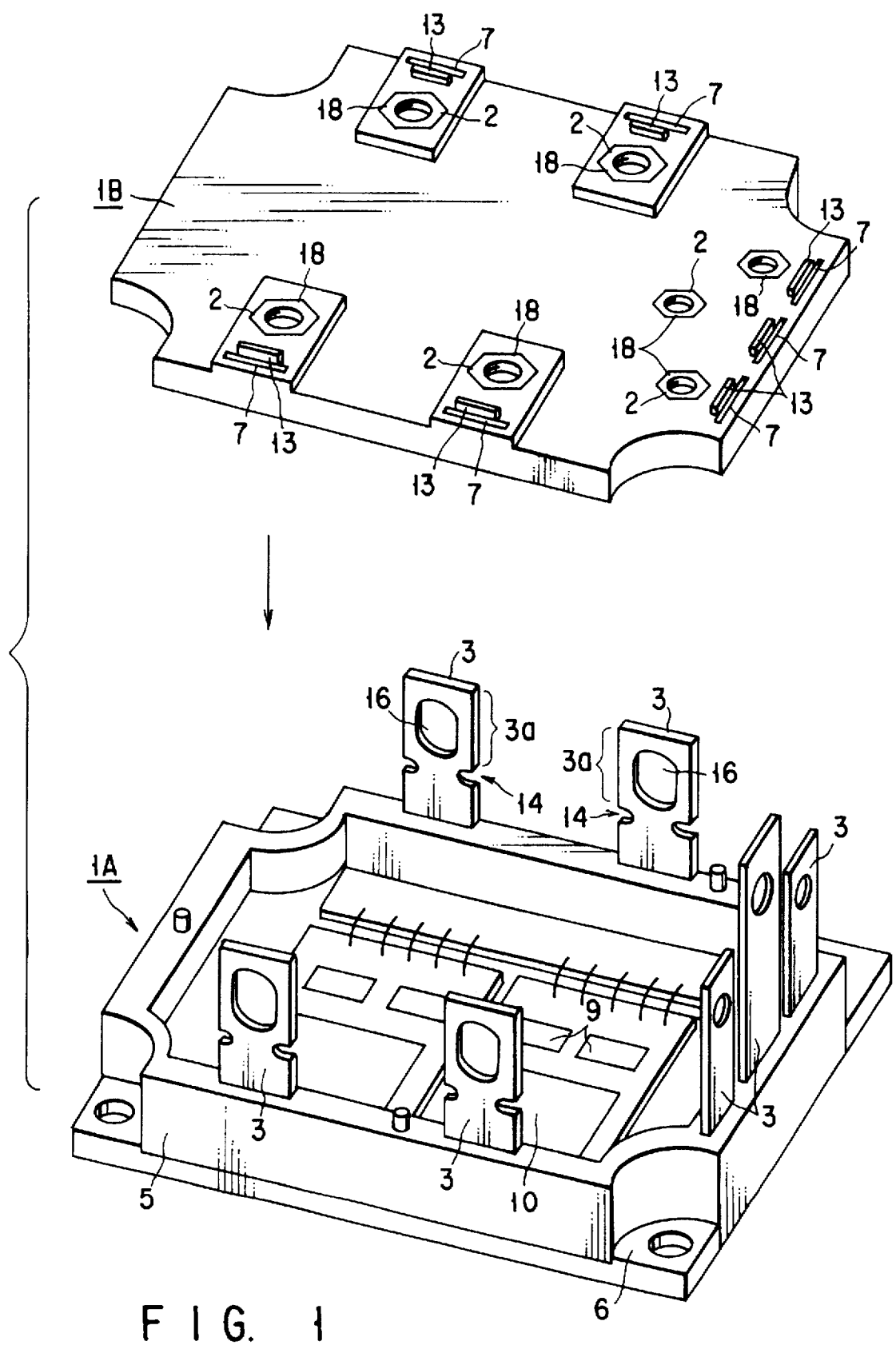
FIG. 1 is an exploded perspective view, showing a semiconductor device according to the invention.

FIG. 1 shows a high-power semiconductor device according to the invention. This device comprises a main body 1A and a cover member 1B (in FIG. 1, the main body 1A and the cover member 1B are separated from each other). The main body 1A has a heat sink 6, an insertion case 5, semiconductor elements such as a diode 9, a transistor 10, etc., and a plurality of electrode terminals 3 connected to the semiconductor elements. The insertion case 5 is made of a synthetic resin such as PBT resin, PPS resin, etc., and the electrode terminals 3 are formed integral with the insertion case 5 as one body. The insertion case 5 is fixed to the heat sink 6 by means of a joint member (not shown), thereby constituting a container for containing the semiconductor elements 9 and 10. PBT resin or PPS resin is molded into the cover member 1B. The member 1B has insertion holes 7 formed therethrough for inserting the electrode terminals 3. A projection 13, which will be described later, is provided at an edge portion of each insertion hole 7.

To mount the cover member 1B on the main body 1A, the electrode terminals 3 are inserted through the insertion holes 7 from below so that they project from the upper surface of the cover member 1B. Those portions of the electrode terminals 3, which project from the upper surface of the cover member 1B and are hereinafter referred to as "external joint portions 3a", are bent inward through 90° by the hand or using a tool, thereby fixing the cover member 1B to the main body 1A.

Further, a plurality of high-power semiconductor devices constructed as above are arranged parallel to each other, and have their electrode terminals electrically connected to each other by means of bus bars and bolts. FIG. 6 shows this arrangement as viewed from above. As is shown in FIG. 6, six semiconductor elements are arranged in two rows. For example, collector electrode terminals located at the outer side of one row are connected to each other by means of a bus bar 15, while emitter electrode terminals located at the outer side of the other row are connected to each other by means of another bus bar 15. A bus bar located at the inner side of each row is omitted in FIG. 6 to show the structure below it. The bus bars 15 are placed on the external joint portions 3a bent on the surface of the cover member 1B, and fixed thereto by screwing bolts 19 into nuts 18 provided in the cover member 1B. To this end, each external joint portion 3a has a through hole 16 for receiving the bolt 19, and the cover member 1B has holes 2 wherein the nuts 18 are fitted, as is shown in FIG. 1. Further, the electrode terminals 3 have respective coining portions 14 similar to those shown in FIGS. 8A–8C for facilitating the bending of the electrode terminals 3 and accurate determination of the external joint portions 3a.

Figure 2B:
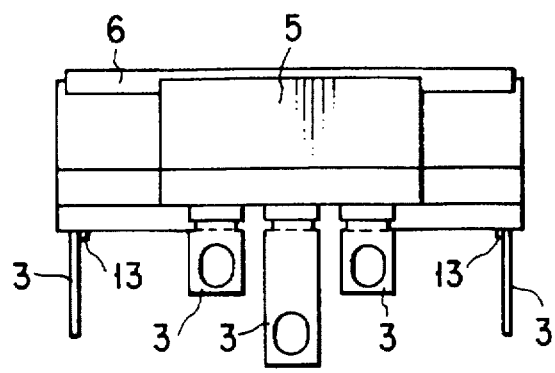
FIG. 2B is a side view of the semiconductor device of FIG. 2A.
Figure 2A:
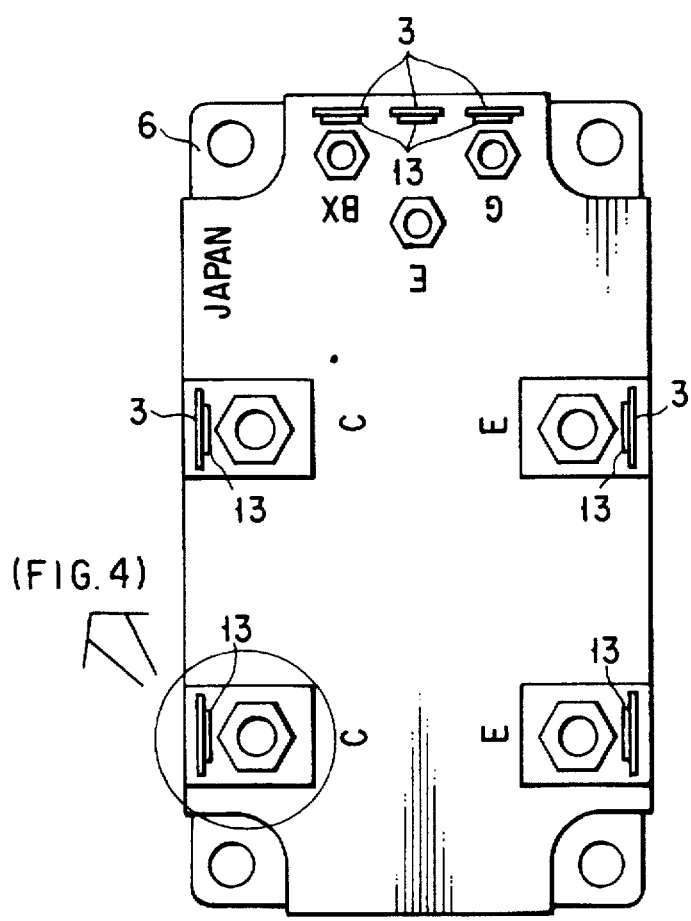
FIG. 2A is a plan view, showing a semiconductor device according to the invention.
Figure 2C:
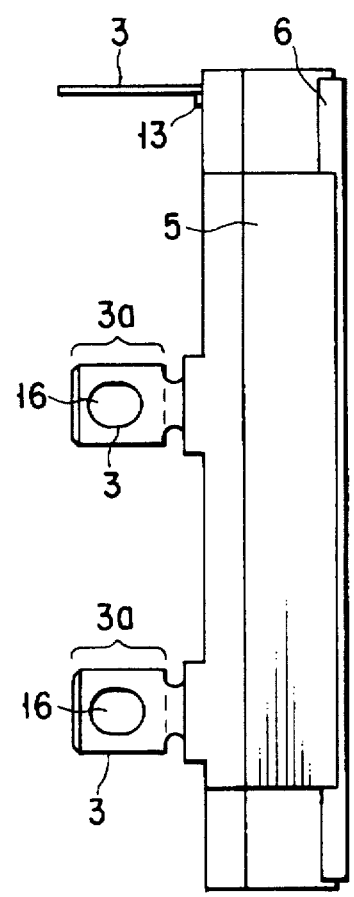
FIG. 2C is another side view of the semiconductor device of FIG. 2A.

Referring then to FIGS. 2 and 3, the method for coupling the cover member 1B with the main body 1A will be described in more detail. First, as is shown in FIGS. 2A, 2B and 2C, the electrode terminals 3 of the main body 1A are inserted into the insertion holes 7 of the cover member 1B, respectively, and the lower surface of the cover member 1B is coupled with the insertion case 5. At this time, the electrode terminals 3 vertically project from the surface of the cover member 1B.

Figure 3B:
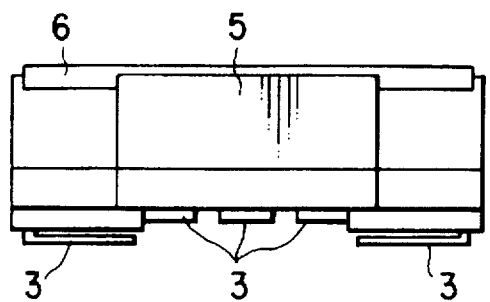
FIG. 3B is a side view of the semiconductor device of FIG. 3A.
Figure 3A:
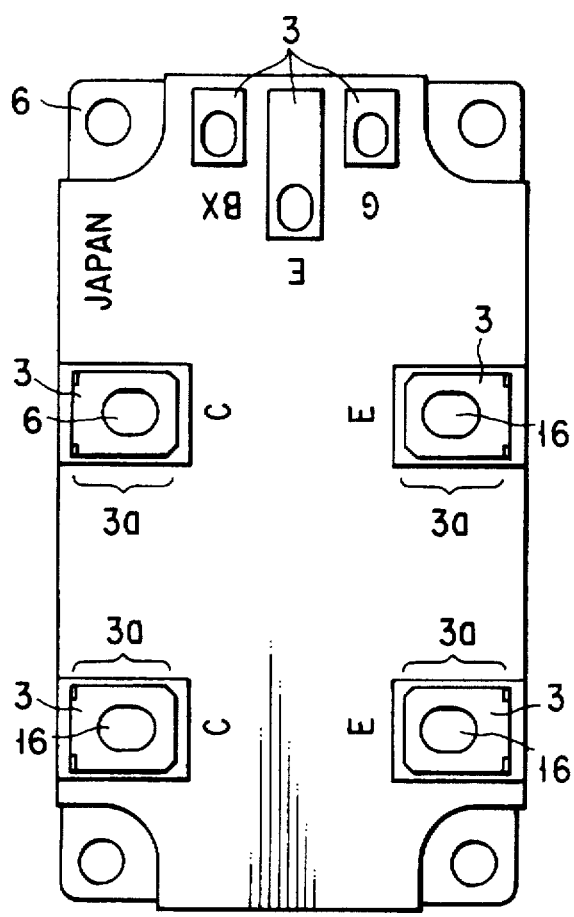
FIG. 3A is a plan view, showing another semiconductor device according to the invention.
Figure 3C:
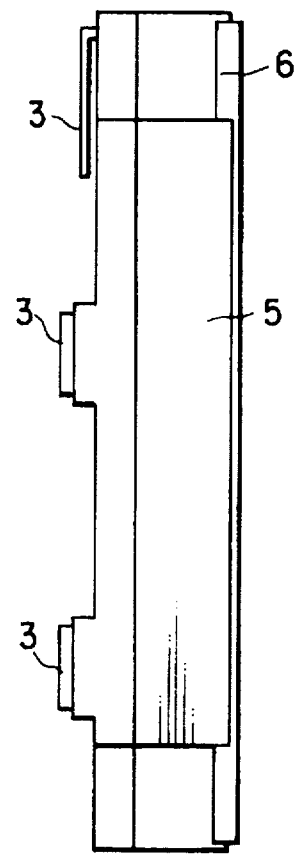
FIG. 3C is another side view of the semiconductor device of FIG. 3A.
Figure 7:
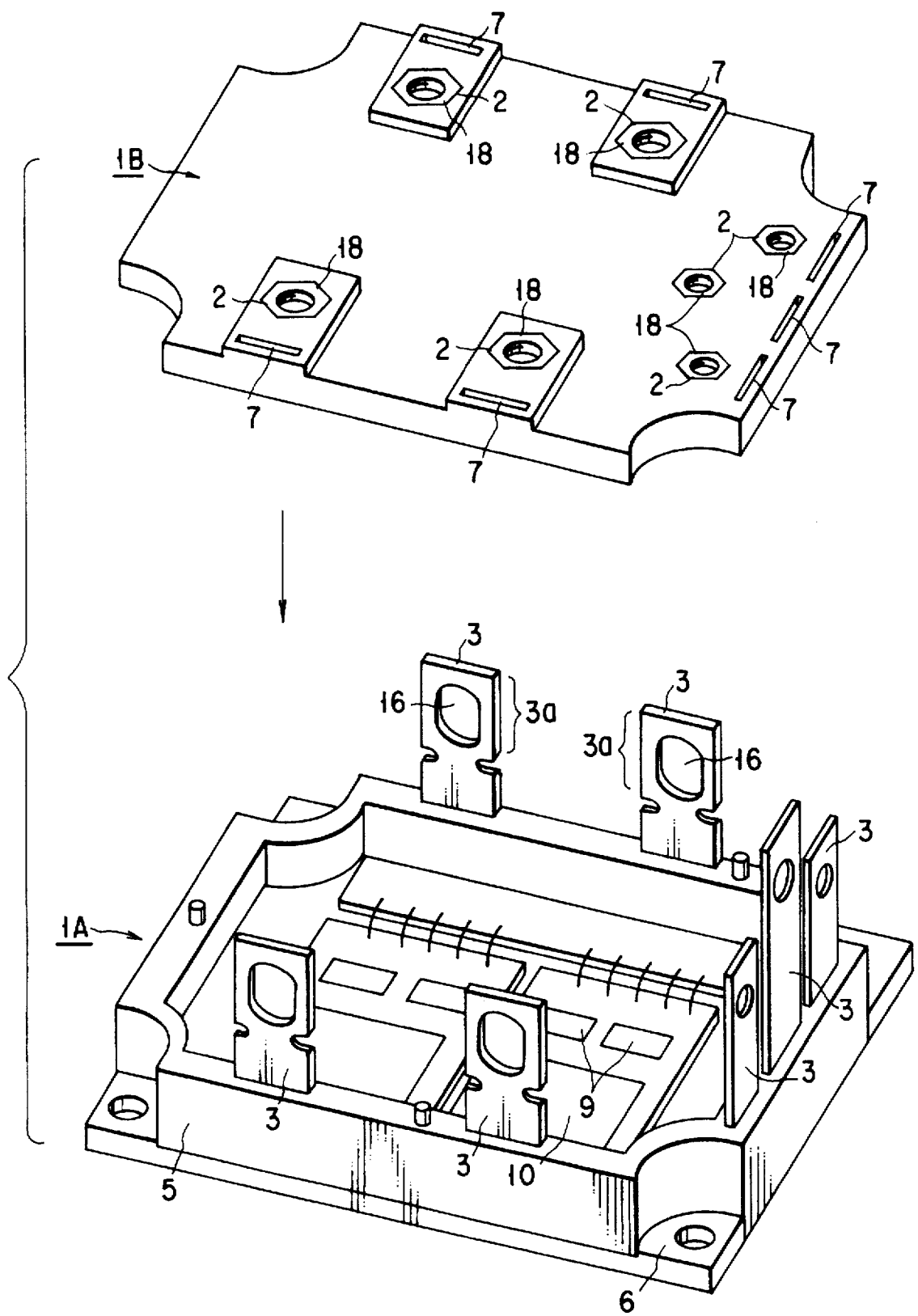
FIG. 7 is an exploded perspective view, showing a conventional semiconductor device.

Thereafter, the nuts 18 are inserted in the holes 2, and the electrode terminals 3 are bent toward the nuts 18, respectively, thereby coupling the cover member 1B with the main body 1A as shown in FIGS. 3A–3C. At this time, the line of bending of each electrode terminal 3 coincides with the edge of a corresponding one of the projections 13 shown in FIG. 1.

FIG. 4 is an enlarged view, showing a state in which the electrode terminal 3 is inserted through the insertion hole 7. FIG. 5A is a plan view, showing the insertion hole 7 and its periphery; FIG. 5B is a sectional view, taken along lines 5B—5B; and FIG. 5C is a sectional view, showing a state in which the electrode terminal 3 is coupled with the bus bar 15. As is aforementioned, the projection 13 is provided adjacent to the insertion hole 7. As is shown in FIGS. 4, 5A and 5B, that side of the projection 13 which contacts the electrode terminal 3 is flush with one side surface of the insertion hole 7. The projection 13 can be formed by slightly modifying the shape of the mold for forming the cover member 1B. When the electrode terminal 3 is bent, the edge of the projection 13 contacts the coining portion 14 of the terminal 3. Thus, the edge of the projection 13 serves to support the coining portion 14 at the time of bending the terminal 3, which means that the bending line of the terminal 3 can accurately be determined. Further, the terminal 3 is bent until its tip reaches the surface of the cover member 1B. In other words, the terminal 3 is bent through more than 90°. When the external or bending force exerted upon the terminal 3 is removed, the terminal 3 is sprung back and the external joint portion 3a becomes parallel to the cover member 1B.

Referring to FIG. 4, the height h, the length a, and the width w of the projection 13 will be described in detail. The height h of the projection 13 is given by $$h = L \times \sin \Delta\theta \quad (1)$$

where $\Delta\theta$ represents the angle of spring back, and L the distance between the bending line of the electrode terminal 3 and the tip of the same.

Where the projection 13 has a height given by the equation (1), the angle defined between the electrode terminal 3 and the surface of the cover member 1B is set to $(90°+\Delta\theta)$ when the terminal 3 is bent until its tip reaches the surface. When the external or bending force exerted upon the terminal is removed, the terminal is sprung back through $\Delta\theta$, and the external joint portion 3a becomes parallel to the cover member 1B. In other words, in this embodiment, the electrode terminal 3 is bent by 90° and an extra angle to offset the spring back angle $\Delta\theta$ which will occur when the external bending force is removed. As a result, the external joint portion 3a becomes parallel to the surface of the cover member 1B.

The spring back angle $\Delta\theta$ is given by the following equation (2), which is recited in "Theory of Plasticity and Plasticity Processing (1982)", page 208, written by Masujiro HAYAMA and published from Ohm Corporation:

$$\Delta\theta = \frac{3F}{(n+2)E} \left(\frac{2p}{t}\right)^{1-n} \left(\frac{\sqrt{3}}{2}\right)^{1-n} \theta \quad (2)$$

where n represents the deformation hardening coefficient of the electrode terminal, E the longitudinal elasticity coefficient of the electrode terminal, p the radius of curvature of the neutral axis of the electrode terminal, t the thickness of the electrode terminal, $\theta$ the bending angle of the electrode terminal, and F a coefficient which satisfies $\rho = F\epsilon^n$ ($\rho$ is a stress occurring in the electrode terminal, and $\epsilon$ a strain occurring in the electrode terminal).

If coefficients appropriate to the material and shape of the electrode terminal 3 are substituted for in the equations (1) and (2), the height h of the projection 13 is obtained. If the electrode terminal 3 is made of copper plated with nickel, the height h of the projection 13 is 0.5 mm.

Further, if the spring back angle is very large, or if the electrode terminal 3 is very long, the height of the projection 13 is set to a very high value. Thus, if the cover member 1B has a very high projection, the nut 18 fitted in the hole 2 of the member 1B will be raised when the bus bar 15 is coupled with the electrode terminal 3 by the bolt 19. This means that the torque for fastening the terminal 3 and the bus bar 15 may well be insufficient. To avoid this, the height of the projection 13 must be set to a value half the thickness of the nut 18 or less.

The length a of the projection 13 shown in FIG. 4 is preferably as short as possible, in order to accurately determine the bending line at which the external joint portion 3a is bent by $(90°+\Delta\theta)$. However, if the length a of the projection 13 is too short, the projection 13 cannot have a sufficient strength, and accordingly may well deform when the external joint portion 3a is bent. To avoid this, it is necessary to control the force exerted upon the projection 13 to bend the external joint portion 3a, so that the stress occurring in the projection 13 can be kept lower than the yield stress of the material of the projection 13. The stress occurring in the projection 13 depends upon the length a, the height h, the width w and the material of the projection 13, and also upon the bending rate of the electrode terminal 3. In light of this, it is necessary to set the length a of the projection 13 to a value which enables the stress occurring therein to be lower than the yield stress thereof, and it is preferable to set the length a to an allowable shortest value.

Moreover, the width w of the projection 13 is most preferably set equal to the width of the bending portion (coining portion) 14. If the width w is extremely smaller than the width of the electrode terminal 3, it cannot be determined where part of the width-directional portion of the electrode terminal 3 should be bent. This being so, the electrode terminal 3 may well be deformed when it is bent. Further, since the manner of deformation varies among products, it is necessary to set the width of the projection 13 to ⅔ or more that of the bending portion of the electrode terminal 3. Furthermore, although it is preferable that the width-directional center of the projection 13 is aligned with that of the electrode terminal 3, they need not always be aligned with each other. In this case, however, the projection 13 must have a width equal to ⅓ or more the width of the electrode terminal 3, from the width-directional center of the terminal 3 toward each of the opposite ends thereof. To set the width w of the projection 13 wider than that of the electrode terminal 3 is not preferable since such a wide projection may become a limitation when the semiconductor apparatus is combined with another apparatus.

Although in the embodiment, the projection 13 is in the shape of a rectangular parallelepiped, it may be in the shape of a trapezoid with a small upper surface and a large lower surface. In this case, the strength of the projection 13 against the external force (bending force) exerted thereon increases, and the length a of the upper surface decreases. This enables the bending line to be accurately determined, and the electrode terminal to be bent substantially at right angles.

It will be clarified how parallel and accurately the electrode terminal 3 can be bent in the embodiment, as compared with the conventional case. As is shown in FIG. 9B, the angle α defined between the external joint portion 3a of the electrode terminal 3 and the surface of the cover member 1B indicates the degree of parallelization of the electrode terminal 3, and the height y of the tip of the electrode terminal 3 from the surface of the cover member 1B indicates the height-directional accuracy of the electrode terminal 3.

TABLE 1

| Parallelization α (degree) | | |
| --- | --- | --- |
| | Prior Art | Present invention |
| Average | 1.74 | 0.51 |
| Standard Deviation | 0.23 | 0.09 |

TABLE 2

| Positional Accuracy y (mm) Standard size 1.7 ± 0.3 | | |
| --- | --- | --- |
| | Prior Art | Present invention |
| Average | 2.12 | 1.70 |
| Standard Deviation | 0.2 | 0.44 |

As is evident from Table 1, in the conventional case, the degree-of-parallelization α is 1.74, while it is as low as 0.51 in the present invention. The standard deviation is 0.23 in the conventional case, while it is as low as 0.09 in the present invention. Further, as is evident from Table 2, the height-directional accuracy y is 2.12 mm for a product with a standard size of 1.7±0.3 mm in the conventional case, while it is as low as 1.70 in the present invention. The standard deviation is 0.2 in the conventional case, while it is as low as 0.04 in the present invention.

As described above, in the semiconductor device of the present invention, the degree-of-parallelization and the positional accuracy of the external joint portion 3a with respect to the surface of the cover member 1B are enhanced, which means that the range of variations in products can be reduced. As a result, defective contact between the external joint portion 3a and the bus bar 15 can be prevented at the time of connecting the joint portion 3a to the bus bar 15 placed thereon by means of the bolt 19.

In addition, in the semiconductor device of the invention, the bending line and the bent shape of the electrode terminal are accurately determined, with the result that the range of variations in products is reduced. Thus, the hole 16 formed in the electrode terminal 3 can easily be aligned with the nut 18, and accordingly the bolt 19 can easily be screwed in the hole and nut.

What is claimed is:

1. A semiconductor device comprising:
   a container with an upper opening containing a semiconductor element, and having an electrode terminal connected to the semiconductor element;
   a cover member for closing the container, the cover member having an insertion hole formed through the cover member from the lower surface to the upper surface, the container being coupled with the cover member by inserting the electrode terminal through the insertion hole to make the same projecting from the upper surface of the cover member, and bending the projecting electrode terminal; and
   a projection provided on the upper surface of the cover member in the vicinity of the insertion hole, to support a bent corner portion of the electrode terminal when the electrode terminal is bent, and an upper surface of the projection being higher than the upper surface of the cover member in which the insertion hole is formed, the electrode terminal being arranged parallel to the upper surface of the cover member when it is bent over the projection.

2. The semiconductor device according to claim 1, wherein the projection has a height equal to a distance which the electrode terminal covers because of a spring back effect when it is bent.

3. The semiconductor device according to claim 2, wherein a spring back angle Δθ through which the electrode terminal rebounds because of the spring back effect is calculated by the following equation:

$$\Delta\theta = \frac{3F}{(n+2)E}\left(\frac{2p}{t}\right)^{1-n}\left(\frac{\sqrt{3}}{2}\right)^{1-n}\theta$$

where n represents the deformation hardening coefficient of the electrode terminal, E the longitudinal elasticity coefficient of the electrode terminal, p the radius of curvature of the neutral axis of the electrode terminal, t the thickness of the electrode terminal, θ the bending angle of the electrode terminal, and F a coefficient which satisfies ρ=Fε$^n$ (ρ is a stress occurring in the electrode terminal, and ε a strain occurring in the electrode terminal).

4. The semiconductor device according to claim 2, wherein that side surface of the projection which contacts the electrode terminal is flush with a side surface of the insertion hole.

5. The semiconductor device according to claim 2, wherein the upper surface of the projection has a length which is along a length of the electrode terminal and which is as short as possible and as enables a maximum main stress, which will occur therein when said electrode terminal is bent, to be lower than the yield stress of material used for the projection.

6. The semiconductor device according to claim 2, wherein the upper surface of the projection has a width which is along a width of the electrode terminal and which is ⅔ or more the width of a bending portion of the electrode terminal.

7. The semiconductor device according to claim 2, wherein the upper surface of the projection has a width which is along a width of the electrode terminal and which is equal to the width of a bending portion of the electrode terminal.

8. The semiconductor device according to claim 1, further comprising a nut fitted in a hole formed in the cover member, a bus bar placed on the bent electrode terminal, and a bolt screwed through the nut and an opening formed in the electrode terminal, the bolt fastening the bent electrode terminal and the bus bar placed thereon.

9. The semiconductor device according to claim 8, wherein the height of the projection is ½ or less the thickness of the nut.

10. A semiconductor device comprising:
    a container with an upper opening containing a semiconductor element, and having a plurality of electrode terminals connected to the semiconductor element;

a cover member for closing the container, the cover member having a plurality of insertion holes formed through the cover member from the lower surface to the upper surface, the container being coupled with the cover member by inserting the electrode terminals through the insertion holes, respectively, to make the electrode terminals projecting from the upper surface of the cover member, and bending the projecting electrode terminals; and a plurality of projections each provided on the upper surface of the cover member in the vicinity of a corresponding one of the insertion holes, to support a bent corner portion of a corresponding one of the electrode terminals when the electrode terminal is bent, the projections having a height equal to a distance which the electrode terminals cover because of a spring back effect when they are bent, the electrode terminals being arranged parallel to the upper surface of the cover member when they are bent over the projections.

11. The semiconductor device according to claim 10, wherein the height h of each of the projections is given by $$h = L \times \sin \Delta\theta$$

where $\Delta\theta$ represents an angle of spring back of each of the electrode terminals, and L a distance of a tip portion of each of the electrode terminals from the bending line thereof.

12. The semiconductor device according to claim 10, wherein that side surface of the projection which contacts the electrode terminal is flush with a side surface of the insertion hole.

13. The semiconductor device according to claim 10, wherein the upper surface of each projection has a length which is along a length of the electrode terminal and which is as short as possible and as enables a maximum main stress, which will occur therein when said electrode terminal is bent, to be lower than the yield stress of material used for the projection.

14. The semiconductor device according to claim 10, wherein the upper surface of each projection has a width which is along a width of the electrode terminal and which is ⅔ or more the width of a bending portion of each electrode terminal.

15. The semiconductor device according to claim 10, wherein the upper surface of each projection has a width which is along a width of the electrode terminal and which is equal to the width of a bending portion of each electrode terminal.

16. The semiconductor device according to claim 10, further comprising nuts fitted in holes formed in the cover member, respectively, bus bars placed on the bent electrode terminals, respectively, and bolts each screwed through a corresponding one of the nuts and an opening formed in a corresponding one of the electrode terminals, the bolts each fastening a corresponding one of the bent electrode terminals and a corresponding one of the bus bars placed thereon.

17. The semiconductor device according to claim 16, wherein the height of each projection is ½ or less the thickness of each nut.

18. A semiconductor device comprising:

a container with an upper opening containing a semiconductor element, and having a plurality of electrode terminals connected to the semiconductor element;

a cover member for closing the container, the cover member having a plurality of insertion holes formed through the cover member from the lower surface to the upper surface, the container being coupled with the cover member by inserting the electrode terminals through the insertion holes, respectively, to make the electrode terminals projecting from the upper surface of the cover member, and bending the projecting electrode terminals; and a plurality of projections each provided on the upper surface of the cover member in the vicinity of a corresponding one of the insertion holes, to support a bent corner portion of a corresponding one of the electrode terminals when the electrode terminal is bent, the projections having a height equal to a distance which the electrode terminals cover because of a spring back effect when they are bent, the electrode terminals being arranged parallel to the upper surface of the cover member when they are bent over the projections;

wherein the cover member has a plurality of holes each formed adjacent to a corresponding one of the projections for receiving a nut, and each of the bent electrode terminals has an opening for passing therethrough a bolt screwed in the nut, the center of the opening being aligned with the center of the nut.

19. The semiconductor device according to claim 18, wherein that side of each of the projections which contacts a corresponding one of the electrode terminals contacts one side edge of a corresponding one of the insertion holes.

20. The semiconductor device according to claim 18, wherein the height of each projection is ½ or less the thickness of each nut.

* * * * *